United States Patent
Sohn (10) Patent No.: US 7,891,868 B2
(45) Date of Patent: Feb. 22, 2011

(54) TEMPERATURE SENSOR AND SEMICONDUCTOR MEMORY DEVICE USING THE SAME

(75) Inventor: Young Chul Sohn, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 446 days.

(21) Appl. No.: 12/005,673

(22) Filed: Dec. 28, 2007

(65) Prior Publication Data

US 2008/0317097 A1 Dec. 25, 2008

(30) Foreign Application Priority Data

Jun. 25, 2007 (KR) ............ 10-2007-0062547

(51) Int. Cl.
*G01K 7/32* (2006.01)
(52) U.S. Cl. .................. 374/170; 374/172
(58) Field of Classification Search .......... 374/170, 374/172
See application file for complete search history.

(56) References Cited

U.S. PATENT DOCUMENTS

| | | | | |
|---|---|---|---|---|
| 3,882,384 A * | 5/1975 | List | ............ | 324/71.1 |
| 4,030,363 A * | 6/1977 | Halleck | ............ | 374/170 |
| 4,061,033 A * | 12/1977 | Nixon | ............ | 374/103 |
| 4,165,642 A * | 8/1979 | Lipp | ............ | 374/170 |
| 4,448,549 A * | 5/1984 | Hashimoto et al. | ............ | 374/170 |
| 6,115,441 A * | 9/2000 | Douglass et al. | ............ | 377/25 |
| 6,560,164 B2 | 5/2003 | Kawai et al. | | |
| 6,695,475 B2 * | 2/2004 | Yin | ............ | 374/171 |
| 7,123,105 B2 | 10/2006 | Kim et al. | | |
| 2004/0071183 A1 * | 4/2004 | Tesi et al. | ............ | 374/1 |
| 2004/0199354 A1 | 10/2004 | Hener et al. | | |
| 2005/0036380 A1 | 2/2005 | Su | | |
| 2006/0066386 A1 * | 3/2006 | Hong | ............ | 327/513 |
| 2006/0285576 A1 * | 12/2006 | Gyoten et al. | ............ | 374/178 |
| 2008/0259997 A1 * | 10/2008 | Gardner et al. | ............ | 374/170 |
| 2009/0066405 A1 * | 3/2009 | Chu | ............ | 327/513 |
| 2010/0141329 A1 * | 6/2010 | Kim | ............ | 327/513 |

FOREIGN PATENT DOCUMENTS

KR 10-2008-0020920 A 3/2008

\* cited by examiner

*Primary Examiner*—Lisa M Caputo
*Assistant Examiner*—Mirellys Jagan
(74) *Attorney, Agent, or Firm*—John P. White; Cooper & Dunham LLP

(57) ABSTRACT

A temperature sensor comprises a pulse signal generating unit for generating a first pulse signal having an enable section, a width of which is adjusted according to a reference voltage having a temperature characteristic, an oscillator for generating a second pulse signal of a predetermined period in the enable section of the first pulse signal, and a counter for performing a counting operation in response to the second pulse signal and generating at least one temperature signal.

24 Claims, 7 Drawing Sheets

TEMPERATURE SENSOR AND SEMICONDUCTOR MEMORY DEVICE USING THE SAME

BACKGROUND

The present disclosure relates to a semiconductor memory device and, more particularly, to a temperature sensor capable of changing electrical characteristics of a transistor and useful for a stable operation of various semiconductor memory devices.

Figure 1:
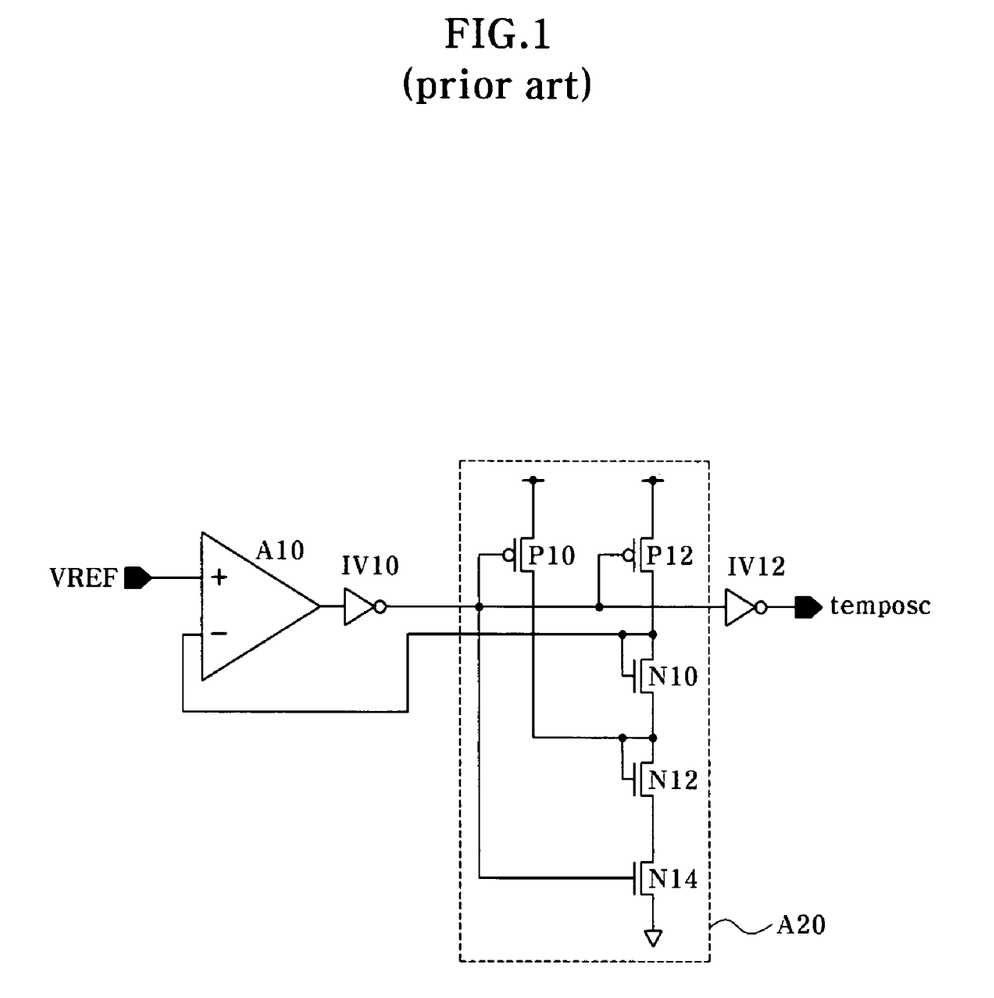
FIG. 1 is a circuit diagram illustrating a temperature sensor according to a conventional semiconductor memory device.

As well-known to those ordinary skilled in the art, a semiconductor memory device, such as a DRAM, can include a temperature sensor to control the operation of internal circuits according to an internal temperature. Referring to FIG. 1, the temperature sensor according to a conventional semiconductor memory device includes a comparator A10 and a temperature sensing unit A20. The comparator A10 compares a reference voltage VREF with a variable voltage depending on the temperature changes in the temperature sensing unit A20 and then outputs the comparison result, as a temperature signal temposc, in a high or low level signal. Meanwhile, the temperature sensing unit A20 includes PMOS transistors P10 and P12 which are turned on in response to an output signal from the comparator A10; an NMOS transistor N10 which is turned on in response to an output signal from the PMOS transistor P12; an NMOS transistor N12 which is turned on in response to an output signal from the PMOS transistor P10; and an NMOS transistor N14 which is turned on in response to the output signal from the comparator A10. The temperature sensor produces the temperature signal temposc having temperature information through the PMOS transistors P10 and P12 and NMOS transistors N10, N12 and N14, temperature characteristics of which are changed in accordance with an internal temperature.

SUMMARY

According to an aspect of the present disclosure, there is provided a temperature sensor comprising a pulse signal generating unit for generating a first pulse signal having an enable section, a width of which is adjusted according to a reference voltage having a temperature characteristic, an oscillator for generating a second pulse signal of a predetermined period in the enable section of the first pulse signal, and a counter for performing a counting operation in response to the second pulse signal and generating at least one temperature signal. The reference voltage can have a temperature characteristic that a level of the reference voltage is reduced when a temperature rises. The enable section width of the first pulse signal may increase when the level of the reference voltage is reduced. The temperature sensor can further comprise an enable signal generating unit for generating an enable signal, which is a period signal and is enabled in a pre-set section. The pulse signal generating unit can include a delay unit having at least one buffer, a driving force of which is adjusted in response to the reference voltage, and the delay unit delaying the enable signal in a predetermined section, and a logic unit configured to receive the enable signal and an output signal of the delay unit and perform a logic operation to generate the first pulse signal. The buffer can include a pull-up element connected between a supply voltage and an output node, for pull-up driving the output node in response to a first signal of an input node, a pull-down element connected between the output node and a ground voltage level, for pull-down driving the output node in response to a second signal of the input node, and a driving control unit connected in series to the pull-down element between the output node and the ground voltage level, for controlling a driving force of the pull-down element in response to the reference voltage. The pull-up element can be a PMOS transistor and the pull-down element and the driving control unit are NMOS transistors. The oscillator can include a logic unit configured to receive the first pulse signal and a signal on the output node and perform a logic operation, and a delay unit for delaying an output signal of the logic unit in a predetermined section. The logic unit can perform a NAND operation and the delay unit can be an inverter chain. The counter may generate temperature signals which are counted sequentially according to the number of pulses of the second pulse signal. The counter can include first and second flip-flops which are connected in series to each other and operate in response to the second pulse signal, wherein the first flip-flop receives an inverted output signal of the second flip-flop. The counter can include a transfer unit for transferring output signals of the first and second flip-flops in response to the enable signal, and a latch for latching an output signal of the transfer unit. The temperature sensor can further comprise a reference voltage generating unit which operates in response to the enable signal and uses a bandgap to generate the reference voltage. The reference voltage generating unit can be driven in response to the enable signal and the temperature signal may be a digital code signal.

According to another aspect to the present disclosure, there is provided a temperature sensor comprising a temperature sensor for generating a pulse signal having an enable section, a width of which is adjusted according to a temperature, and generating a temperature signal corresponding to the enable section width of the pulse signal, and a temperature control unit configured to receive the temperature signal, extract temperature information on an internal temperature and perform a temperature control operation by using the driven temperature information. The temperature control unit may perform the temperature control operation to control a refresh period according to the temperature information. The temperature control unit may perform the temperature control operation to control a level of an internal voltage according to the temperature information.

BRIEF DESCRIPTION OF THE DRAWINGS

The above and other features of the subject matter of the present disclosure will be more clearly understood from the following detailed description taken in conjunction with the accompanying drawings, in which.

DETAILED DESCRIPTION OF EXEMPLARY EMBODIMENTS

Hereinafter, the present invention will be described through examples and exemplary embodiments. The examples and exemplary embodiments merely exemplify the present invention, and the scope of the present invention is not limited by them.

Figure 2:
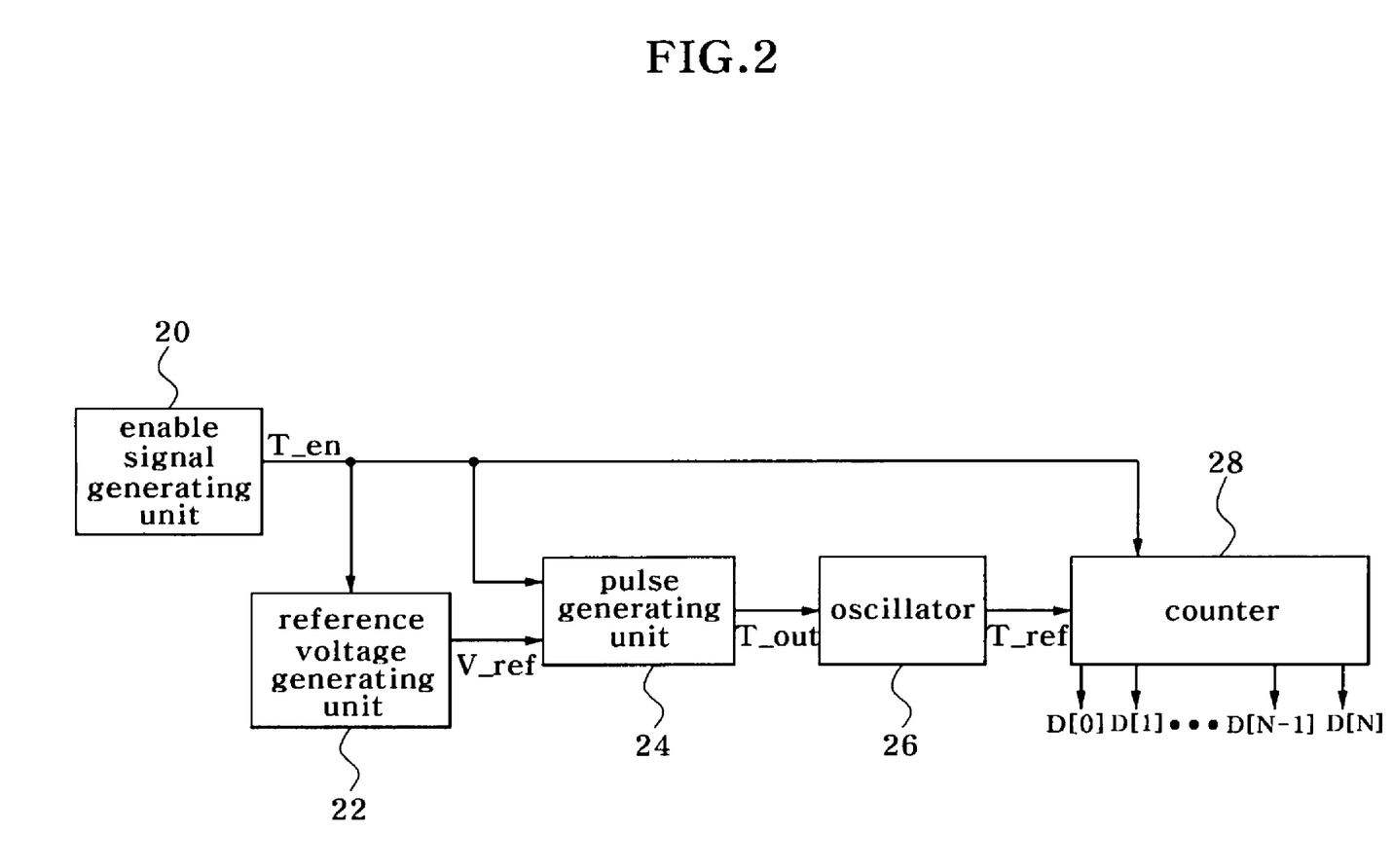
FIG. 2 is a block diagram illustrating a temperature sensor according to an exemplary embodiment of the present disclosure.

FIG. 2 is a block diagram illustrating a temperature sensor according to an exemplary embodiment of the present disclosure.

As illustrated in FIG. 2, the temperature sensor according to an exemplary embodiment of the present disclosure includes an enable signal generating unit 20, a reference voltage generating unit 22, a pulse generating unit 24, an oscillator 26 and a counter 28.

The enable signal generating unit 20 is typically implemented by a pulse generating circuit to generate a pulse signal, which has a constant period, and it generates an enable signal T_en which is enabled in a pre-set section every predetermined period.

The reference voltage generating unit 22 is typically implemented by a bandgap reference voltage generating circuit and it generates a reference voltage V_ref, a level of which is reduced when an internal temperature of a semiconductor memory element increases. That is, the level of the reference voltage is inversely proportional to the internal temperature.

Figure 3:
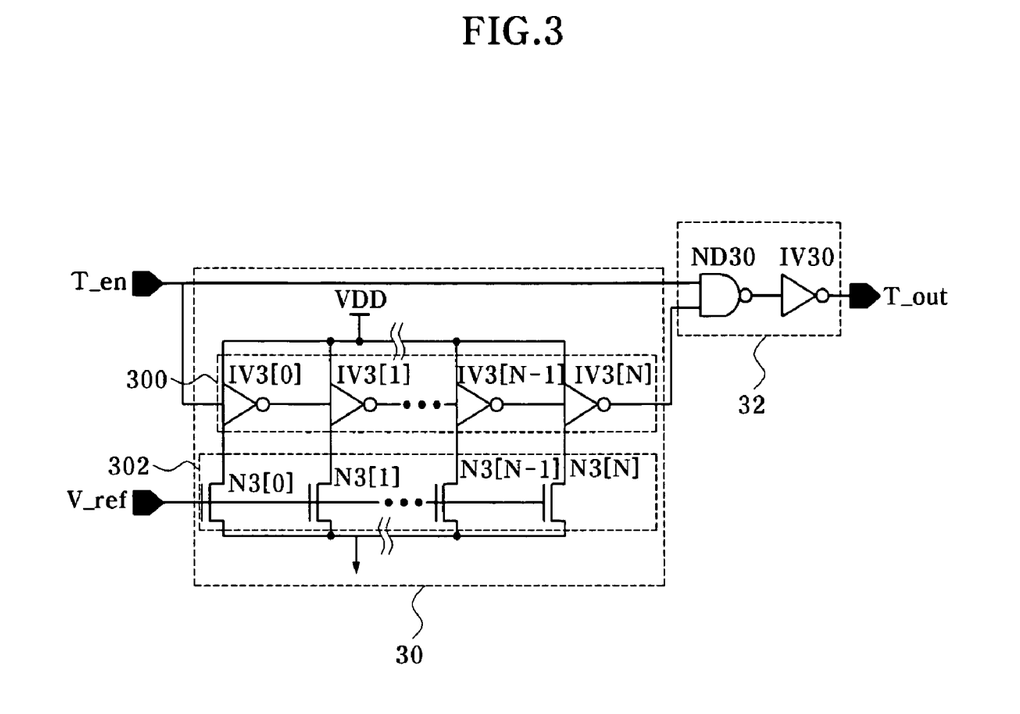
FIG. 3 is a circuit diagram of a pulse generating unit in the temperature sensor of FIG. 2.

The pulse generating unit 24, as illustrated in FIG. 3, includes a delay section control unit 30 and a logic unit 32 which generates a first pulse signal T_out by performing a logic multiplication operation to the enable signal T_en and an output signal of the delay section control unit 30. The delay section control unit 30 includes an inverter chain 300 having a plurality of inverters IV3[0] to IV3[N] which delay the enable signal T_en for a predetermined section and a driving control unit 302 having a plurality of NMOS transistors N3[0] to N3[N] which control a driving force of the inverter chain 300. The driving force of the inverters IV3[0] to IV3[N] is controlled by the NMOS transistors N3[0] to N3[N] connected to each inverter.

Figure 4:
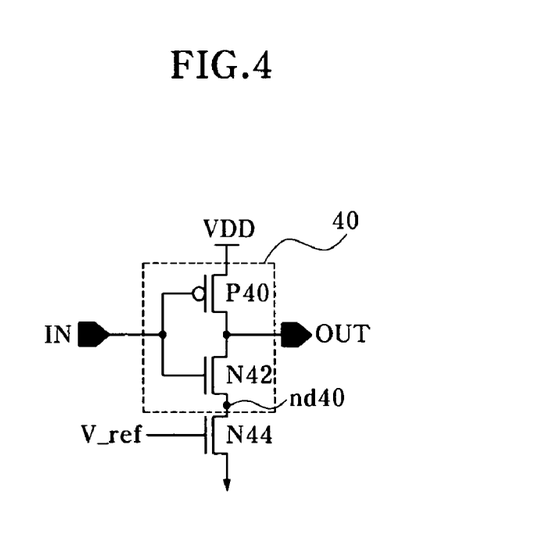
FIG. 4 is a detailed circuit diagram of an inverter and a driving control element in the pulse generating unit of FIG. 3.

FIG. 4 is a detailed circuit diagram illustrating the connection between the inverters IV3[0], IV3[1] to IV3[N] and the NMOS transistors N3[0] to N3[N]. As illustrated in FIG. 4, a NMOS transistor N44 which is a driving control element is connected in series to a NMOS transistor N42, which functions as a pull-down element of an inverter 40, and controls a pull-down driving force according to a level of the reference voltage V_ref.

Figure 5:
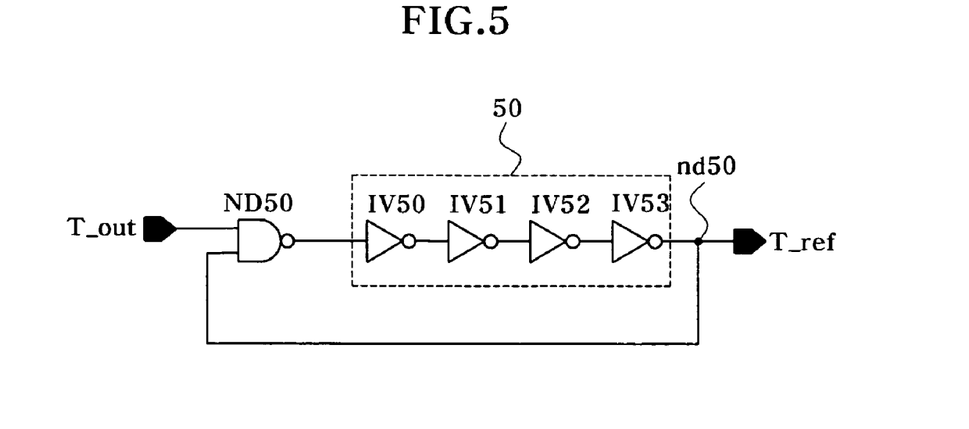
FIG. 5 is a circuit diagram of an oscillator in the temperature sensor of FIG. 2.

The oscillator 26, as illustrated in FIG. 5, includes a NAND gate ND50, which receives signals of the first pulse signal T_out and a signal on a node nd50 and then performs a NAND operation, and an inverter chain 50 which delays an output signal of the NAND gate ND50 for a predetermined section and generates a second pulse signal T_ref. The oscillator 26 can be implemented by various oscillating circuits according to exemplary embodiments besides the ring oscillator.

Figure 6:
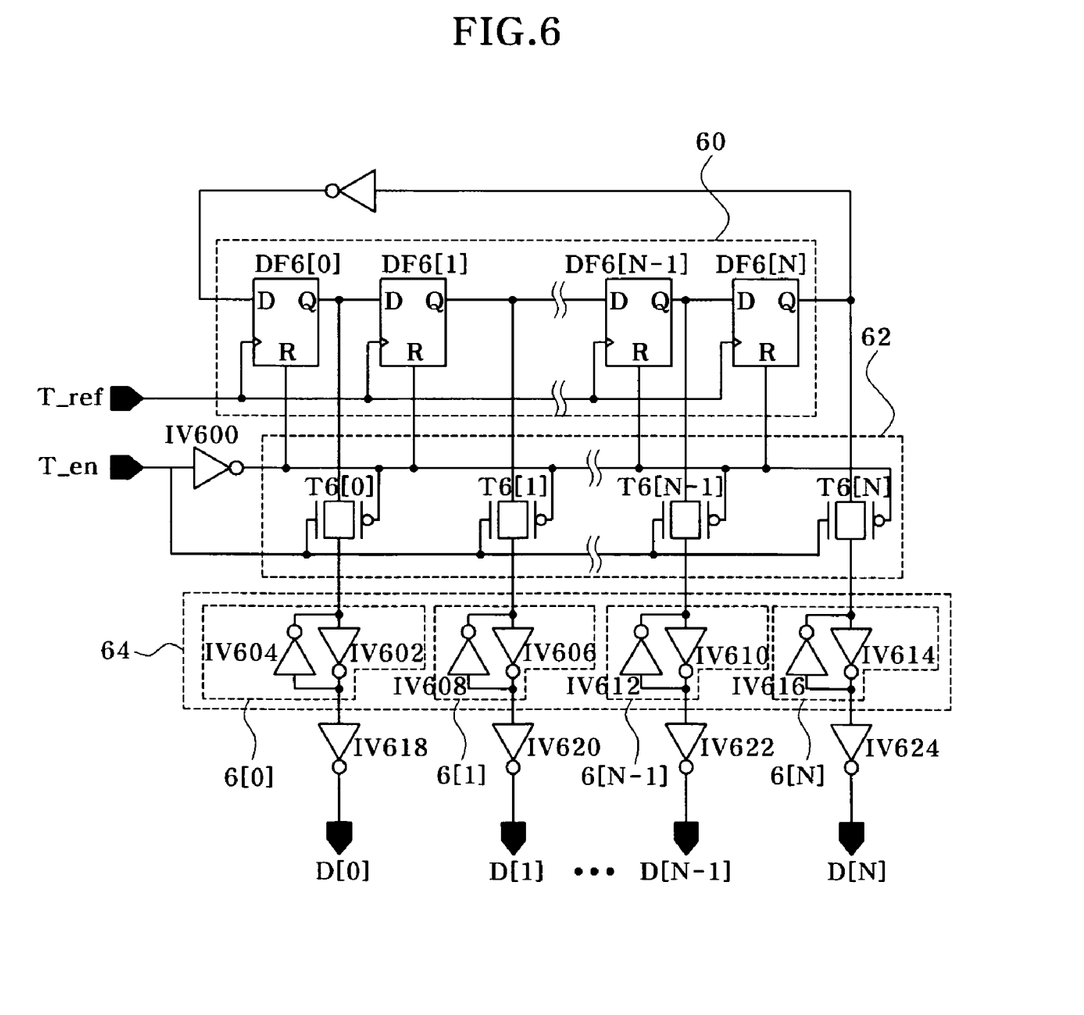
FIG. 6 is a circuit diagram of a counter in the temperature sensor of FIG. 2.

The counter 28, as illustrated in FIG. 6, includes a flip-flop unit 60 having N numbers of D flip-flops DF6[0] to DF6[N] which are connected in series, a transfer unit 62 having N numbers of transfer gates T6[0] to T6[N], each of which delivers an output signal of the flip-flop unit 60 in response to the enable signal T_en of a high level, a latch unit 64 for latching signals transferred from the transfer unit 62, and inverters IV618, IV620, ..., IV622 and IV624 for inversely buffering an output signal of the latch unit 64 respectively and generating temperature signals D[0] to D[N]. The D flip-flops DF6[0] to DF6[N] of the flip-flop unit 60 are reset in response to a reset signal of a high level when the enable signal T_en is in a low level and output a low level signal through a data output terminal Q, and they output a signal inputted to a data input D through the data output terminal Q when a second pulse signal T_ref is in a high level.

The operation of the temperature sensor is described in detail below referring to the timing diagram of FIG. 7.

Figure 7:
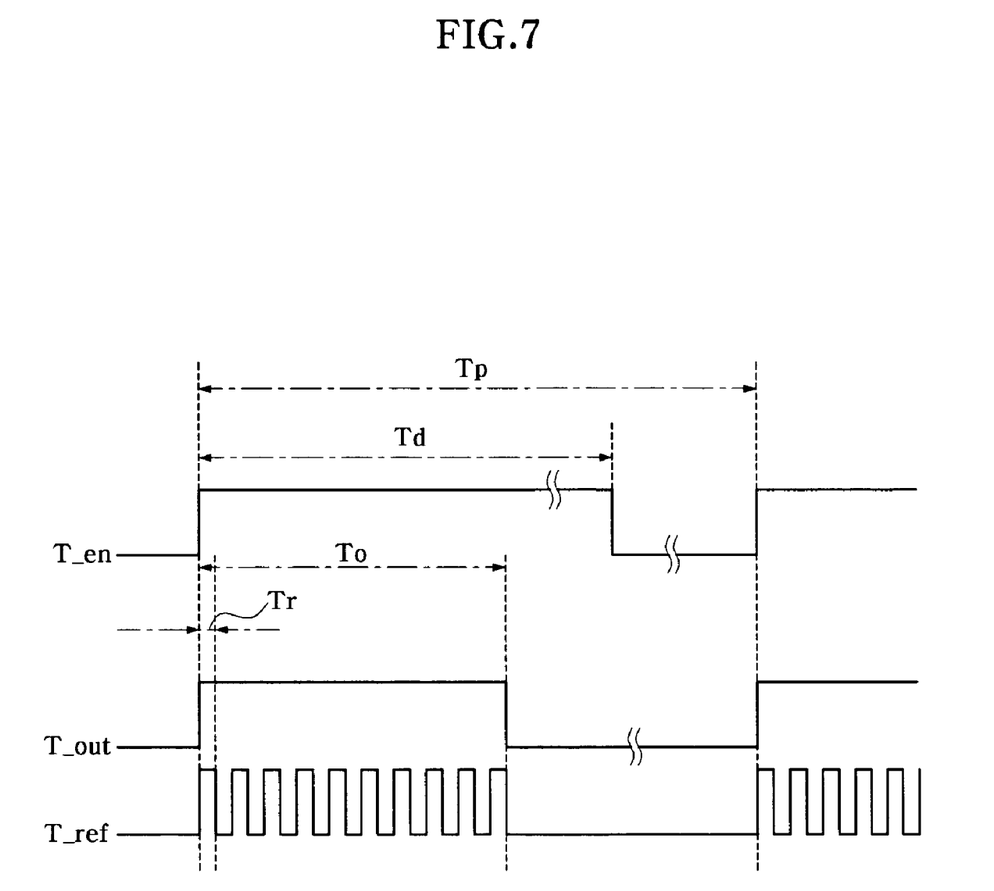
FIG. 7 is a timing chart for explaining operation of the temperature sensor of FIG. 2.

First, as illustrated in FIG. 7, the enable signal generating unit 20 generates an enable signal T_en which has a time period of Tp and is enabled during the time of Td. The enable signal T_en specifies whether to supply a voltage to the reference voltage generating unit 22 and controls operations of the pulse generating unit 24 and the counter 28. Since the enable signal T_en is a periodic signal, internal temperature sensed by the temperature sensor is controlled by the time period Tp of the enable signal T_en. That is, the temperature sensor reduces a consumption current which is necessary for sensing by preventing unnecessary internal temperature sensing through determining an optimal time period Tp for sensing a temperature according to exemplary embodiments of this disclosure.

Figure 8:
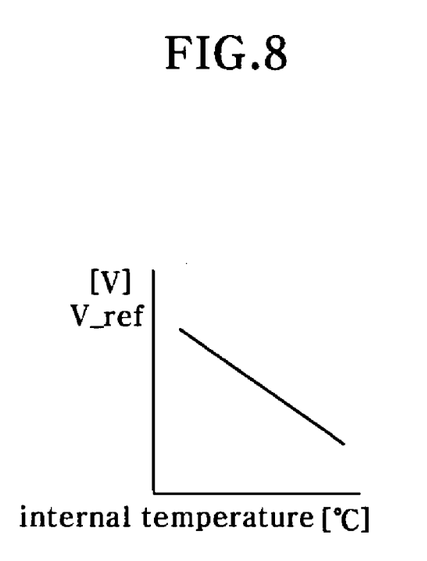
FIGS. 8 and 9 are graphs illustrating characteristics of a reference voltage and a first pulse signal generated in the temperature sensor of FIG. 2.

The reference voltage generating unit 22, as illustrated in FIG. 8, generates a reference voltage V_ref, a level of which is inversely proportional to an internal temperature of a semiconductor memory element.

The pulse generating unit 24 receives an enable signal T_en and a reference voltage V_ref and generates the first pulse signal T_out. The pulse generating unit 24 reduces a current consumption by generating the first pulse signal T_out having a constant enable section width only in a case that the enable signal T_en is in a high level. The generation of the first pulse signal T_out in the pulse generating unit 24 in the case that the enable signal T_en is in a high level will be described below.

Figure 9:
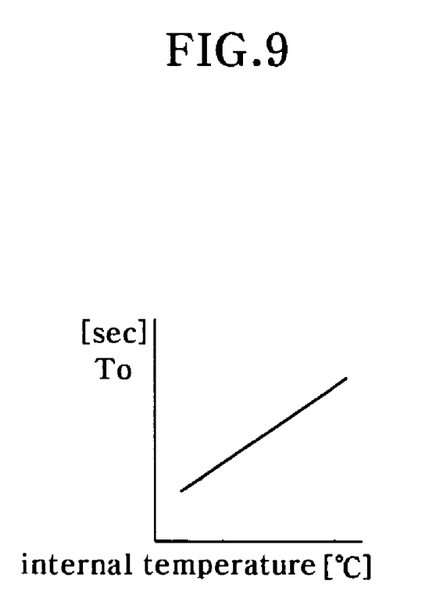

Referring to FIG. 3, the inverter chain 300 includes an odd number of inverters and delays and inverses the enable signal T_en for a section To. Thus, the first pulse signal T_out is enabled in a high level for the section To and is formed into a signal having the same time period Tp as the enable signal T_en. At this time, the enable section width To of the first pulse signal T_out is controlled by a driving control unit 302 which operates in response to the reference voltage V_ref. For example, in a case that an internal temperature increases, the level of the reference voltage V_ref is reduced and applied to NMOS transistors N3[0] to N3[N] included in the driving control unit 302. Therefore, an amount of current flowing out of the NMOS transistors N3[0] to N3[N] is reduced, and the pull-down driving force of inverters IV3[0] to IV3[N] is reduced. The reduction in the pull-down driving force of the inverters IV3[0] to IV3[N] increases a passing time of the enable signal T_en in the inverter chain 300 and increases the enable section width To of the first pulse signal T_out. Accordingly, as illustrated in FIG. 9, if an internal temperature increases, the enable section width To of the first pulse signal T_out increases, and if the internal temperature decreases, the enable section width To of the first pulse signal T_out decreases.

The oscillator 26 receives the first pulse signal T_out and generates a second pulse signal T_ref having a section width Tr for the section To while the first pulse signal T_out is in a high level. Referring to FIG. 5, in a case that the first pulse signal T_out is in a high level, the oscillator 26 performs an oscillating operation because the NAND gate ND50 operates as an inverter, and in a case that the first pulse signal T_out is in a low level, it generates the second pulse signal T_ref which is set to a constant level, either a high level or a low level, and ceases the oscillating operation. Therefore, the oscillator 26 generates the second pulse signal T_ref having the pulse width Tr which is determined by the NAND gate ND50 and an inverter chain 50, wherein the NAND gate ND50 operates as an inverter for the section To while the first pulse signal T_out is in a high level. The number of pulses of the second pulse signal T_ref, that is, the more the number of pulses enabled in a high level increases, the more the enable section width To of the first pulse signal T_out increases.

The counter 28 receives the second pulse signal T_ref and the enable signal T_en and generates temperature signals D[0] to D[N]. Referring to FIG. 5, in a case that the enable signal T_en is in a low level, D flip-flops DF6[0] to DF6[N] are reset to output a low level signal and all the transfer gates T6[0] to T6[N] are turned off. That is, a counting operation of the counter 28 is not performed. Meanwhile, if the enable signal T_en is transited to a high level, the D flip-flops DF6[0] to DF6[N] generate a count output according to the number of pulses of the second pulse signal T_ref. For example, in a case that the number of pulses of the second pulse signal T_ref is two, only an output through the data output terminal Q of D flip-flops DF6[0] and DF6[1] is in a high level and outputs through the data output terminals Q of the remaining D flip-flops DF6[2] to DF6[N] are in a low level. Also, as the transfer gates T6[0] to T6[N] are all turned on by the enable signal T_en of a high level, an output signal of the flip-flop unit 60 is transferred to a latch unit 64 and outputted as the temperature signals D[0] to D[N]. As mentioned above, in a case that the number of pulses of the second pulse signal T_ref is two, the generated temperature signals D[0] and D[1] are in a high level and the remaining temperature signals D[2] to D[N] are in a low level. Accordingly, in a case that the enable signal T_en is in a high level, the counter 28 performs the counting operation and outputs the temperature signals D[0] to D[N] which are counted according to the number of pulses of the second pulse signal T_ref and enabled in a high level sequentially.

The temperature sensor according to an exemplary embodiment of the present invention does not always sense an internal temperature. The temperature sensor senses a temperature only in a case that the enable signal T_en is in a high level so that it reduces a current consumption. That is, a current consumed in an internal temperature sensing is reduced by the operations of the reference voltage generating unit 22, the pulse generating unit 24 and the counter 28 only in a case that the enable signal T_en is in a high level.

Also, the temperature sensor according to an exemplary embodiment of the present invention senses the internal temperature by using the first pulse signal T_out having an enable section width which is varied according to the internal temperature of a semiconductor memory element. Thus, temperature sensing can be performed stably without an occurrence of the problem that temperature sensing becomes unstable due to the change of characteristic of a MOS transistor in accordance with the internal temperature.

Further, the temperature sensor according to an exemplary embodiment of the present invention includes the counter 28 and generates the temperature signals D[0] to D[N] in a digital code mode. The temperature signals D[0] to D[N] in a digital code mode are easier to store than those in an analog mode and can be easily used in various internal circuits included in a semiconductor memory.

Hereafter, a semiconductor memory device using a temperature sensor according to an exemplary embodiment of the present invention will be described in detail referring to FIG. 10.

Figure 10:
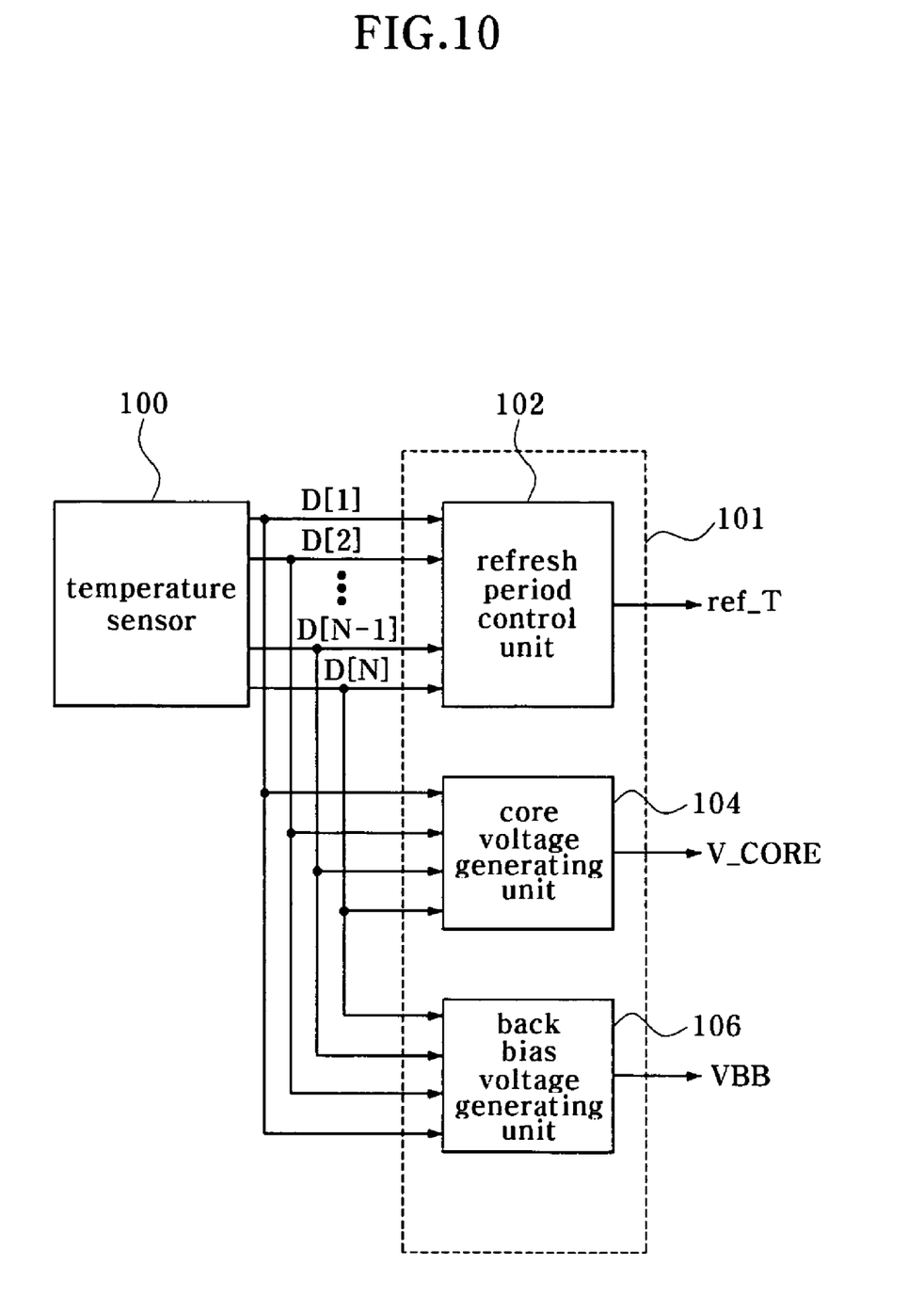
FIG. 10 is a block diagram illustrating a semiconductor memory device using a temperature sensor according to an exemplary embodiment of the present invention.

As illustrated in FIG. 10, the semiconductor memory device includes a temperature sensor 100 for generating a pulse signal in which an enable section width is adjusted according to a temperature and generating a temperature signal in a digital code mode which is counted by the enable section width of the pulse signal, and a temperature control unit 101 configured to receive temperature signals D[1] to D[N], extract temperature information corresponding to the internal temperature and perform a temperature control operation by using the extracted temperature information. Since the temperature sensor 100 is described in detail above in connection with FIGS. 1 to 9, a detailed description will be omitted in the interest of brevity.

The temperature control unit 101 includes a refresh period control unit 102 for performing a temperature control operation which controls a refresh period according to temperature information, a core voltage generating unit 104 for controlling a level of a core voltage VCORE according to the temperature information, and a back bias voltage generating unit 106 for controlling level of a back bias voltage VBB according to the temperature information. The temperature control unit 101 receives temperature signals D[1] to D[N] of a plurality of bits and extracts the temperature information. While a method of decoding the temperature signals D[1] to D[N] and extracting the temperature information can be used for the temperature control, it is preferable to use the method of extracting the temperature information from the temperature signals D[1] to D[N] as described in the present disclosure.

For example, the information corresponding to the internal temperature according to the inputted temperature signals D[1] to D[3] can be extracted by set up of the temperature signals (D[1]='1', D[2]='0', D[3]='0') corresponding to a first temperature section (i.e., 80~82° C.), the temperature signals (D[1]='1', D[2]='1', D[3]='0') corresponding to a second temperature section (i.e., 82~84° C.), and the temperature signals (D[1]='1', D[2]='1', D[3]='1') corresponding to a third temperature section (i.e., 84~86° C.). That is, the temperature control unit 101 can perform various temperature control operations according to the inputted temperature signals D[1] to D[3]. For example, the refresh period control unit 102 can generate a refresh signal ref_T which is controlled by a refresh period corresponding to the second temperature section (i.e., 82~84° C.) to which the temperature signals (D[1]='1', D[2]='1', D[3]='0') are inputted. Also, the core voltage generating unit VBB can generate a core voltage VCORE corresponding to the third temperature section (i.e., 84~86° C.) in a case that the temperature signals (D[1]='1', D[2]='1', D[3]='1') are inputted.

Although the temperature sensor according to examples and exemplary embodiments of the present disclosure is described as being used in a refresh period and a level change of an internal voltage, it can be used not only in a semiconductor memory device but also in other devices that need temperature information.

The present application claims priority to Korean application number 10-2007-0062547, filed on Jun. 25, 2007, the entire contents of which are incorporated herein by reference.

What is claimed is:

1. A temperature sensor comprising:
   a pulse signal generating unit configured to receive a reference voltage and an enable signal and generate a first pulse signal, wherein the first pulse signal has an enable section which is adjusted according to the reference voltage having a temperature characteristic;

an oscillator configured to receive the first pulse signal and generate a second pulse signal, wherein the second pulse signal comprises at least one pulse having a predetermined period in the enable section of the first pulse signal; and a counter configured to receive the enable signal and perform a counting operation in response to the second pulse signal and generating at least one temperature signal.

2. The temperature sensor of claim 1, wherein the oscillator includes:

a logic unit configured to receive the first pulse signal and a signal on an output node and perform a logic operation; and a delay unit for delaying an output signal of the logic unit in a predetermined section.

3. The temperature sensor of claim 1, wherein the counter generates temperature signals which are counted sequentially according to a number of pulses of the second pulse signal.

4. The temperature sensor of claim 1, wherein the temperature signal is a digital code signal.

5. The temperature sensor of claim 1, wherein the reference voltage has a temperature characteristic that a level of the reference voltage is reduced when a temperature rises.

6. The temperature sensor of claim 5, wherein a width of the enable section of the first pulse signal increases when the level of the reference voltage is reduced.

7. The temperature sensor of claim 1, wherein the counter includes first and second flip-flops which are connected in series to each other and operate in response to the second pulse signal and wherein the first flip-flop receives an inverted output signal of the second flip-flop.

8. The temperature sensor of claim 7, wherein the counter includes:

a transfer unit for transferring output signals of the first and second flip-flops in response to an enable signal; and a latch for latching an output signal of the transfer unit.

9. The temperature sensor of claim 1, further comprising an enable signal generating unit for generating the enable signal, wherein the enable signal is a period signal and is enabled in a pre-set section.

10. The temperature sensor of claim 9, wherein the pulse signal generating unit includes:

a delay unit having at least one buffer, a driving force of the delay unit being adjusted in response to the reference voltage, and the delay unit delaying the enable signal in a predetermined section; and a logic unit configured to receive the enable signal and an output signal of the delay unit and perform a logic operation to generate the first pulse signal.

11. The temperature sensor of claim 10, wherein the buffer includes:

a pull-up element connected between a supply voltage and an output node, for pull-up driving the output node in response to a first signal of an input node;

a pull-down element connected between the output node and a ground voltage level, for pull-down driving the output node in response to a second signal of the input node; and a driving control unit connected in series to the pull-down element between the output node and the ground voltage level, for controlling a driving force of the pull-down element in response to the reference voltage.

12. The temperature sensor of claim 9, further comprising a reference voltage generating unit which operates in response to the enable signal and uses a bandgap to generate the reference voltage.

13. The temperature sensor of claim 12, wherein the reference voltage generating unit is driven in response to the enable signal.

14. A semiconductor memory device comprising:

a temperature sensor for generating a pulse signal having an enable section, a width of the enable section being adjusted according to a reference voltage, and generating a temperature signal corresponding to the width of the enable section of the pulse signal, wherein a level of the reference voltage is reduced when a temperature rises; and a temperature control unit configured to receive the temperature signal, extract temperature information corresponding to an internal temperature and perform a temperature control operation by using the extracted temperature information.

15. The semiconductor memory device of claim 14, wherein the temperature control unit performs the temperature control operation to control a refresh period according to the temperature information.

16. The semiconductor memory device of claim 15, wherein the temperature control unit performs the temperature control operation to control a level of an internal voltage according to the temperature information.

17. The semiconductor memory device of claim 14, wherein the temperature sensor includes:

a pulse signal generating unit configured to receive a reference voltage and an enable signal and generate a first pulse signal wherein the first pulse signal has an enable section which is adjusted according to the reference voltage having a temperature characteristic;

an oscillator configured to receive the first pulse signal and generate a second pulse signal wherein the second pulse signal comprises at least one pulse having a predetermined period in the enable section of the first pulse signal; and a counter configured to receive the enable signal and perform a counting operation in response to the second pulse signal and generating at least one temperature signal.

18. The semiconductor memory device of claim 17, wherein the enable section width of the first pulse signal increases when the level of the reference voltage decreases.

19. The semiconductor memory device of claim 17, wherein the counter generates temperature signals corresponding to a sequential count of a number of pulses of the second pulse signal.

20. The semiconductor memory device of claim 17, wherein the counter includes first and second flip-flops connected in series to each other and operating in response to the second pulse signal and wherein the first flip-flop receives an inverted output signal of the second flip-flop.

21. The semiconductor memory device of claim 20, wherein the counter includes:

a transfer unit for transferring output signals of the first and second flip-flops in response to the enable signal; and a latch for latching an output signal of the transfer unit.

22. The semiconductor memory device of claim 17, further comprising an enable signal generating unit for generating the enable signal, wherein the enable signal is a period signal and enabled in a pre-set section.

23. The semiconductor memory device of claim 22, wherein the pulse signal generating unit includes:
- a delay unit having at least one buffer, a driving force of the delay unit being adjusted in response to the reference voltage, and the delay unit delaying the enable signal in a predetermined section; and
- a logic unit configured to receive the enable signal and an output signal of the delay unit and perform a logic operation to generate the first pulse signal.

24. The semiconductor memory device of claim 23, wherein the buffer includes:
- a pull-up element connected between a supply voltage and an output node, for pull-up driving the output node in response to a first signal of an input node;
- a pull-down element connected between the output node and a ground voltage level, for pull-down driving the output node in response to a second signal of the input node; and
- a driving control unit connected in series to the pull-down element between the output node and the ground voltage level, for controlling driving force of the pull-down element in response to the reference voltage.

* * * * *